(12) United States Patent
Washburn

(10) Patent No.: US 6,275,108 B1
(45) Date of Patent: Aug. 14, 2001

(54) CIRCUIT AND METHOD FOR CONTROL OF AMPLIFIER OPERATING ANGLE

(75) Inventor: Clyde Washburn, Victor, NY (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/525,995

(22) Filed: Mar. 15, 2000

(51) Int. Cl.[7] ........................................ H03F 3/45
(52) U.S. Cl. ........................ 330/255; 330/273; 330/276
(58) Field of Search ................................. 330/255, 273, 330/276, 262, 264, 263, 267, 269

(56) References Cited

U.S. PATENT DOCUMENTS

| | | | |
|---|---|---|---|
| 6,084,475 | * | 7/2000 | Rincon-Mora ........................ 330/255 |
| 6,184,750 | * | 2/2001 | Somerville ........................... 330/255 |
| 6,208,208 | * | 3/2001 | Komatsu et al. ..................... 330/255 |

* cited by examiner

*Primary Examiner*—Tuan T. Lam

(57) ABSTRACT

A method and apparatus for controlling amplifier operating angle provides a corresponding increase in amplifier efficiency through a continual adjustment of operating angle from Class A, through Class AB, to Class B, an improved bandwidth in the output stage by preventing the output stage from reaching cutoff and the ability to adjust the high frequency content of the drive waveform to match that of the output stage thereby attaining the highest efficiency consistent with required distortion levels. A push-pull amplifier is coupled to a differential pushpull current drive source with out of phase drive signals and a preprocessing circuit with a first set of current sources which mirror one drive signal and a second set of current sources which mirror the other drive signal. The preprocessing circuit provides a full-wave rectified signal substantially representing the combined lower halves of the out of phase drive signals to be summed with the drive signals as composite input waveforms for the push-pull amplifier. The rectified signal is common-mode to both sides of the amplifier and gives instantaneous control of the bias point such that it is always just large enough to support the instantaneous amplitude of the signals as it adjusts the operating angle of the push-pull amplifier from Class A through Class B. A transformer is coupled to the output stages of the push-pull amplifier for summing the output signals.

17 Claims, 3 Drawing Sheets

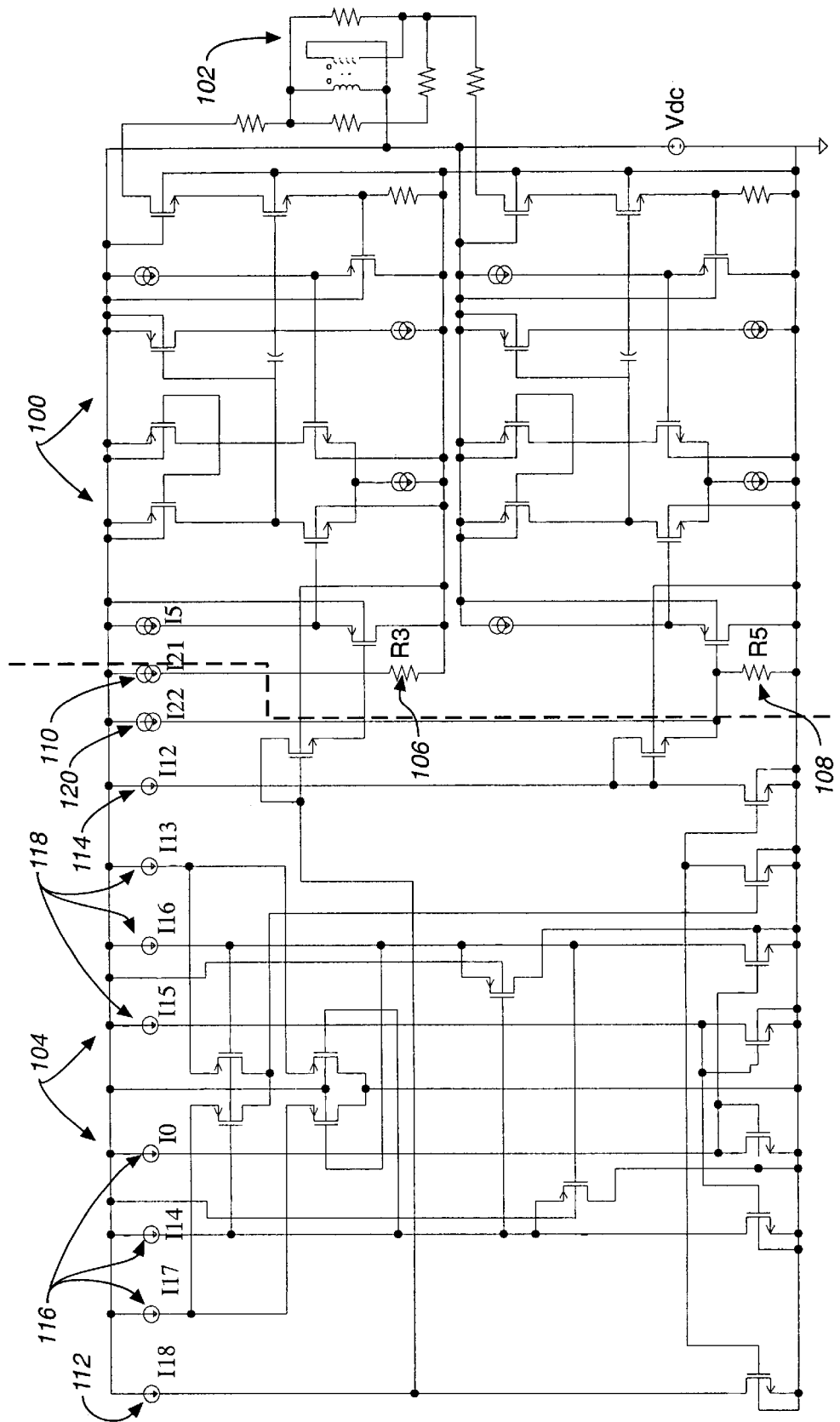
FIG._1

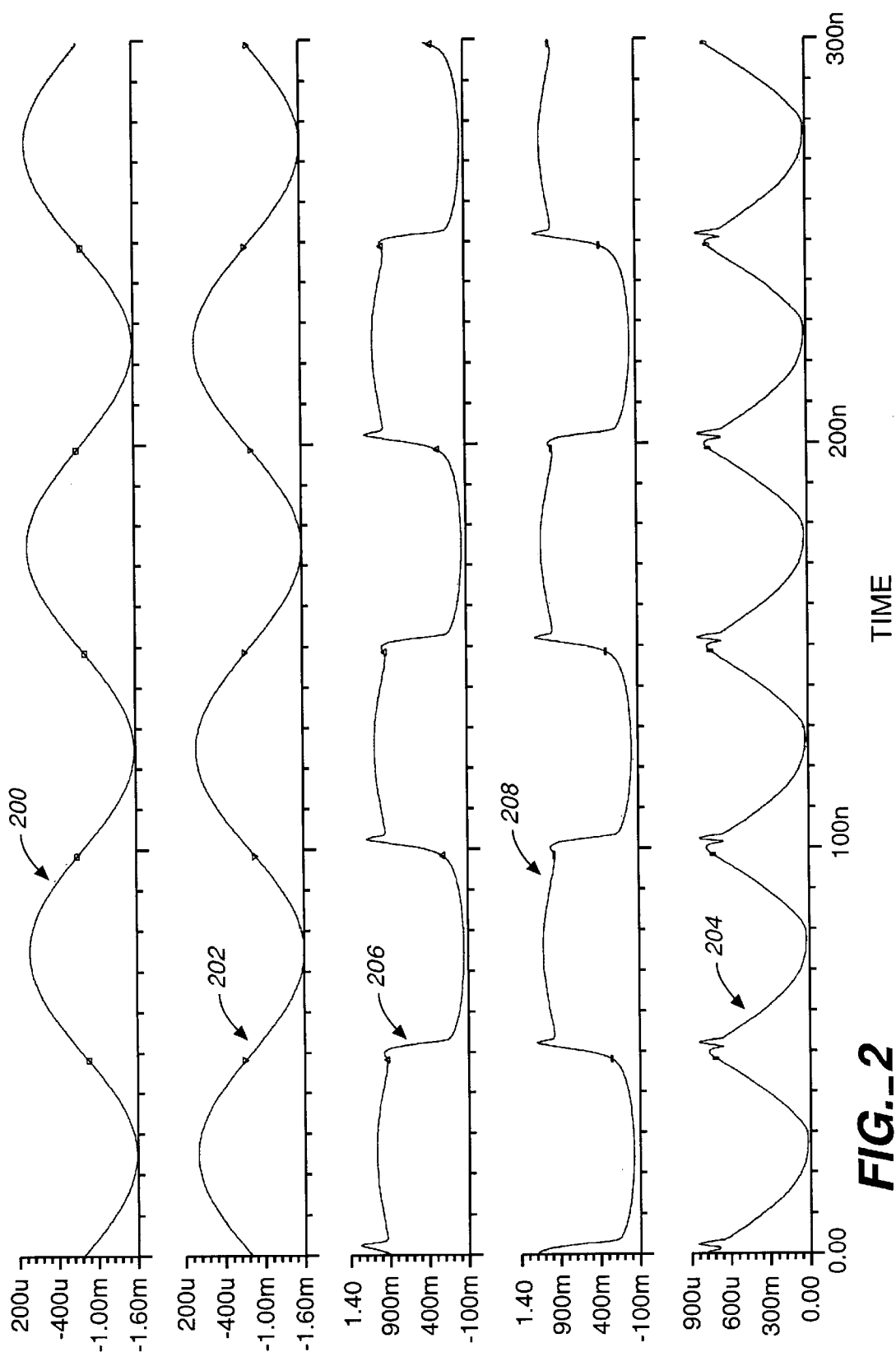
FIG._2

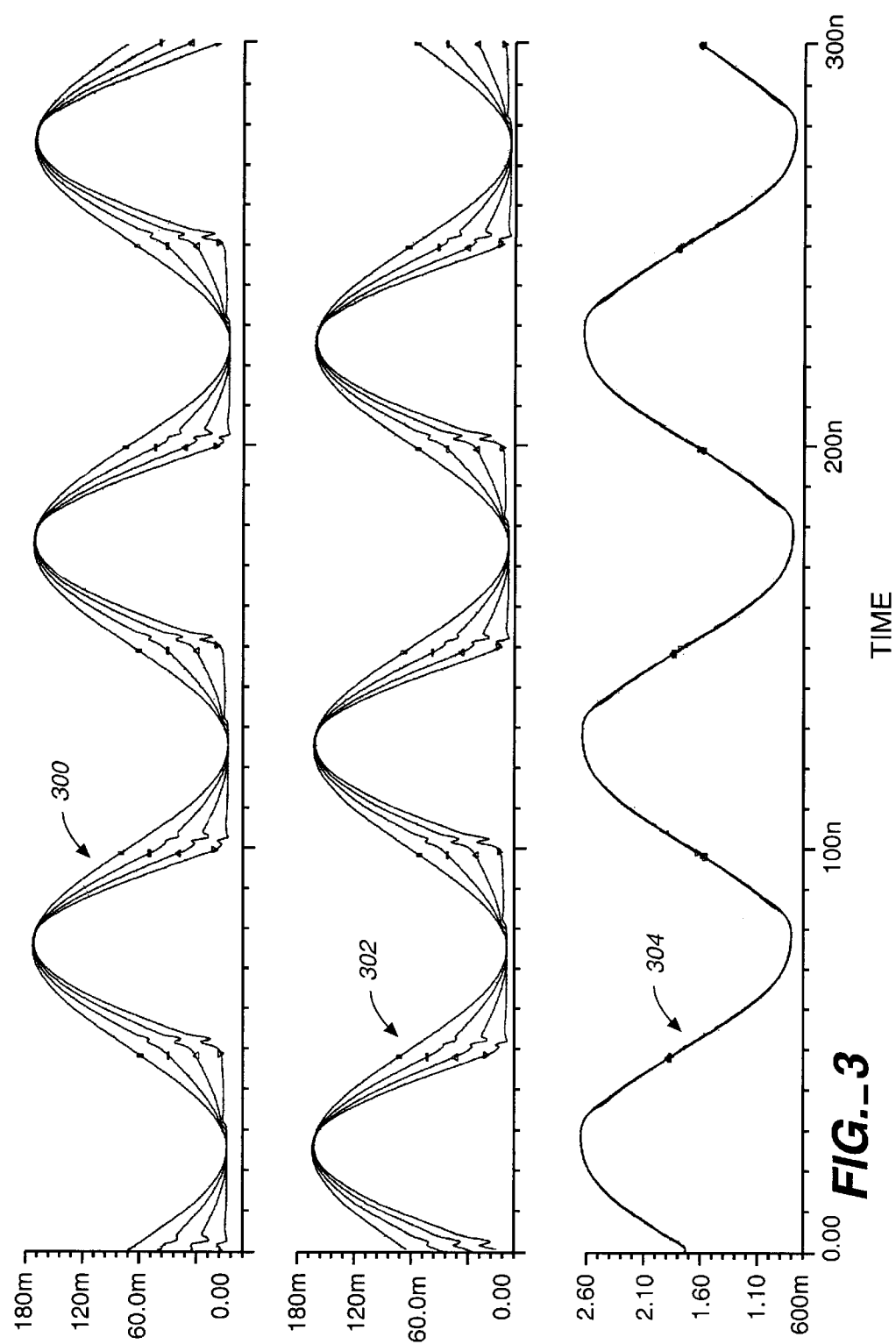
FIG._3

CIRCUIT AND METHOD FOR CONTROL OF AMPLIFIER OPERATING ANGLE

BACKGROUND OF THE INVENTION

1. Field of the Invention

The present invention is generally directed to improving amplifier efficiency through controlling amplifier operating angle. More specifically, the present invention is directed to a circuit and method for continually adjusting amplifier operating angle from Class A through Class B which can prevent driving the output into cutoff, thereby avoiding associated gain nonlinearities and improving output stage bandwidth while providing higher efficiencies corresponding to reduced operating angles.

2. Background

The basic concept of push-pull amplification can be described as an amplifier in which there are two similar signal branch circuits operating in phase opposition whose outputs are combined in a difference or summing circuit to produce an increased power output. Amplifier efficiency varies with the amplifier operating angle which can be adjusted by setting the amplifier bias point. Amplifier operating voltages are selected in the absence of applied signals to set a quiescent (Q) operating point which determines the amount of output signal swing that can occur without clipping the signal.

The Q point in a Class A amplifier is chosen such that the output device is always conducting (e.g. collector current in a bipolar transistor or drain current in a field-effect transistor) and the output signal can swing symmetrically over the full 360 degrees of a driving sine wave. The output stage bias current is greater than the maximum output current so that the output devices always conduct current. The Q point is biased in the middle of the DC load line which permits the full symmetrical fluctuation of the driving sine wave along the AC load line. This biasing method provides an amplifier with a potentially distortionless operating point which reproduces the entire input signal. However, the Class A amplifier is very inefficient due to the quiescent power dissipated in maintaining the Q point. Therefore, operating angles of less than 360 degrees are desired because they produce progressively higher efficiency as the operating angle is reduced.

The Q point in Class B amplifiers is chosen at cutoff such that current flows through the output device over half or 180 degrees of the driving sine wave. Class B amplifiers are more efficient than Class A amplifiers because the ratio of average DC current to load current is improved by the absence of quiescent bias current. However, in a Class B push-pull configuration the output stages in the amplifier conduct alternately with one device conducting during positive swings of the driving sine wave and the other device conducting during negative swings. This means the drive signal magnitude would need to be doubled to yield the same output as a similarly configured Class A amplifier. Furthermore, the Class B amplifier may result in crossover distortion as conduction passes from one device to the other, as well as other distortions and gain errors. For example, if the operating angle becomes less than 180 degrees a portion of the input waveform is not reproduced, resulting in distortion and gain error. Similarly, if the operating angle becomes more than 180 degrees the gain is approximately double for the portion of the input waveform where both devices conduct, again resulting in distortion and gain error. These distortion and gain errors are due to difficulties in maintaining the correct overlap point resulting from variations in process, temperature and supply voltage.

Class AB amplifiers are variations of Class B amplifiers and are biased in a manner that reduces much of the crossover distortion and associated nonlinearity found in Class B amplifiers. The Q point in Class AB amplifiers is biased close to the edge of cutoff resulting in an output for any slight input signal variation. In this case, distortionless operation requires that the total gain of the two sides when both are conducting be exactly equal to the gain of one side conducting alone. Each output device handles only a little more than half of the output waveform, and thus, like the Class B amplifier the Class AB amplifier would require the drive signals to be approximately doubled to yield the same output as a similarly configured Class A amplifier. However, Class AB amplifiers differ from Class B amplifiers in that maintaining the Q point requires a small bias current to flow even when there is no input signal. This current increases the power consumption of the Class AB amplifier, but it is nowhere near the power consumed in a Class A amplifier. The operating region for Class AB amplifiers is between 360 and 180 degrees, which provides an amplifier efficiency better than Class A but not as good as Class B.

Therefore, to yield the same output as the Class A amplifier, both the Class B and AB amplifiers would require an input signal approximately twice as large. Additionally, the output stages for the Class B and AB amplifiers may not have sufficient bandwidth to accurately trace the abrupt on/off transitions in the drive waveforms, resulting in output distortion. It is therefore clear that the disadvantages of presently available amplifiers include very few low-distortion operating points which are only suitable when hit with high accuracy, gain differences which vary from 2 to 1 (Class A to Class B) with operating points, and the requirement for increasing bandwidth in the output stages of amplifiers as efficiency proceeds beyond that of Class A amplifiers.

Accordingly, there exists a need for a method of operating push-pull amplifier output stages in the Class AB to Class B operating region (i.e. a conduction angle of less than 360 degrees down to 180 degrees) for signal inputs without driving the output devices abruptly into cutoff and thereby avoiding gain nonlinearities in the almost-cutoff transfer region. Additionally, the need exists in such amplifiers for the output stages to accurately trace input drive signals as the high frequency content of these signals is adjusted, thereby reducing distortion resulting from a failure of the output stage to trace the input waveform correctly.

SUMMARY OF THE INVENTION

A method and apparatus for controlling amplifier operating angle provides a corresponding increase in amplifier efficiency through a continual adjustment of operating angle from Class A, through Class AB, to Class B, an improved bandwidth in the output stage by preventing the output stage from reaching cutoff and the ability to adjust the high frequency content of the drive waveform to match that of the output stage thereby attaining the highest efficiency consistent with required distortion levels. A push-pull amplifier is coupled to a differential pushpull current drive source with out of phase drive signals and a preprocessing circuit with a first set of current sources which mirror one drive signal and a second set of current sources which mirror the other drive signal. The preprocessing circuit provides a full-wave rectified signal substantially representing the combined lower halves of the out of phase drive signals to be summed with the drive signals as composite input waveforms for the push-pull amplifier. The rectified signal is common-mode to both sides of the amplifier and gives instantaneous control of the bias point such that it is always just large enough to support the instantaneous amplitude of the signals as it adjusts the operating angle of the push-pull amplifier from Class A through Class B. A transformer is coupled to the output stages of the push-pull amplifier for summing the output signals.

BRIEF DESCRIPTION OF THE DRAWINGS

FIG. 1 is a circuit diagram illustrating a push-pull amplifier with a transformer-coupled output and a preprocessing circuit in accordance with a specific embodiment of the present invention.

FIG. 2 is a waveform illustration of input driving currents, switching voltages and rectified current in accordance with a specific embodiment of the present invention.

FIG. 3 is a waveform illustration of composite input signals and the resulting output signal as rectified current is injected from 1% to 100% in accordance with a specific embodiment of the present invention.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons having the benefit of this disclosure.

A specific embodiment of the present invention is illustrated by the circuit of FIG. 1 which includes a push-pull amplifier 100 using a transformer-coupled output 102 and a preprocessing circuit 104. Although the transformer-coupled output is illustrated in the circuit of FIG. 1 as an autotransformer, it is not limited to this implementation and other coupled output configurations known to those skilled in the art are within the scope of this disclosure.

The push-pull amplifier 100 is the circuitry in FIG. 1 extending from R3 106 and R5 108 to the right margin but excluding current source I21 110. The push-pull amplifier 100 in this embodiment is a current mirror, where currents applied to R3 106 and R5 108 are summed out of phase in the output transformer 102. However, other push-pull amplifier configurations as are known to those skilled in the art are within the scope of this disclosure. Current sources I18 112 and I12 114 provide first and second drive signals which are out of phase with one another and which make up a differential push-pull current drive source coupled to the push-pull amplifier 100. Considering just the push-pull amplifier 100 in isolation as an example of its operation as a conventional amplifier, the application of a first drive signal 200 and a second drive signal 202 as illustrated in FIG. 2 which have a minimum value of just above zero and a maximum value of 1.6 ma would result in Class A operation because both sides of the amplifier are conducting at all times. The only other potentially distortionless operating point possible using conventional circuitry would be where the inputs were summed with an opposing current of the center value (approximately 0.8 ma in this example) which would result in output stages conducting alternately with a 180 degree or Class B operating angle.

However, the push-pull amplifier 100 coupled with the preprocessing circuit 104 of the present invention permits a continual adjustment of the operating point from Class A to Class B such that it is always just large enough to support the instantaneous amplitude of the signal. In the preprocessing circuit 104 of FIG. 1, duplicate current sources I17/I14/I0 116 and I15/I16/I13 118 are used to create a full-wave rectified signal which represents the lower portion of the drive signals from current sources I18 112 and I12 114. Referring to FIG. 2, application of the first drive signal 200 and the second drive signal 202 results in a full-wave rectified signal 204. To create the full-wave rectified signal 204, the duplicate current sources I17/I14/I0 116 and I15/I16/I13 118 are made to functionally mirror the current sources I18 112 and I12 114, which is easily accomplished in the application specific integrated circuit (ASIC) applications of this circuit. A first switching waveform 206 and a second switching waveform 208 as illustrated in FIG. 2 are generated by mirroring two differential currents I0 116 and I15 118 of FIG. 1 and using the inverted currents in opposition to differential currents I14 116 and I16 118. The remaining differential currents I17 116 and I13 118 are then cross-switched in double balanced mixer fashion to form a full-wave rectifier. The positive-going output of the full-wave rectified signal is discarded while the negative-going output as illustrated by the full-wave rectified signal 204 of FIG. 2 is the signal used for summation at the amplifier inputs.

By summing or injecting the full-wave rectified signal 204 in varying amounts with the drive signals 200, 202 from current sources I18 112 and I12 114, the amplifier operating point may be continuously adjusted from Class A to Class B as illustrated by trace one 300 and trace two 302 of FIG. 3. Trace one 300 and trace two 302 represent composite input waveforms generated by summing the full-wave rectified signal 204 with the drive signals 200, 202 from current sources I18 112 and I12 114. The composite input waveforms illustrated in this example by trace one 300 and trace two 302 are then input to each side of the amplifier 100. Trace three 304 of FIG. 3 shows that the output gain remains unchanged as the injected level of the full-wave rectified signal 204 of FIG. 2 varies from 1% to 100% of the input drive signal level while the amplifier efficiency responds accordingly to the reduced operating angle. This result is not surprising since the injected full-wave rectified signal 204 goes to its lowest value (approximately zero) when the first drive signal 200 and second drive signal 202 are at either their high or low peaks, which means summing in the new signal has very little potential to change the peak. Furthermore, the injected full-wave rectified signal 204 is summed equally on both sides so it represents a common-mode effect which is inherently ignored by the common-mode rejection of the balanced amplifier 100. Accordingly, imperfections in the injected full-wave rectified signal 204 such as the glitches near the peak have very little effect on the amplifier output signal.

The circuit of the present invention has the additional feature of injecting a keep-on current as common-mode at the amplifier inputs to insure the linearity of its transfer function. This is done by using the current sources I22 120 and I21 110 shown in FIG. 1. Keeping the output amplifier 100 sufficiently on to insure the linearity of its transfer function is possible since the current waveform is brought to zero on the amplifier inputs by the summation of opposing signals rather than by driving the amplifier 100 into cutoff. The amplifier's 100 ability to trace the high frequency components of the waveform corners as Class B operation is approached is improved by not requiring the amplifier 100 to recover from a cutoff zero-current condition on each cycle.

Advantages of the present invention over the prior art include providing for a continual adjustment of amplifier operating angle from Class A (360 degrees) through Class AB to Class B (180 degrees) with the corresponding increase in amplifier efficiency. The circuit and method of the present invention additionally provide a means of preventing the amplifier output stage from reaching cutoff, which improves output stage bandwidth by removing current-starved cutoff behavior from the output cycle. A further advantage of the present invention permits the adjustment of the drive waveform high frequency content to match that of the output stage, thereby providing the highest efficiency consistent with the required distortion levels.

Alternative Embodiments

While embodiments and applications of this invention have been shown and described, it would be apparent to those skilled in the art having the benefit of this application that many more modifications than mentioned above are possible without departing from the inventive concepts herein. The invention, therefore, is not to be restricted except in the spirit of the appended claims.

What is claimed is:

1. A circuit for controlling the operating angle of an amplifier, comprising:
   a push-pull amplifier;
   a differential push-pull current drive source having first and second drive signals coupled to said push-pull amplifier, said first and second drive signals being out of phase with one another;
   a preprocessing circuit having a first set of current sources which mirror said first drive signal and a second set of current sources which mirror said second drive signal, said preprocessing circuit coupled to said push-pull amplifier and providing a full-wave rectified signal substantially representing the combined lower halves of said first and second drive signals for summation with said first and second drive signals; and
   a transformer coupled to output stages of said push-pull amplifier for summing first and second output signals.

2. The circuit as recited in claim 1, wherein said full-wave rectified signal is at a minimum during the peak signal excursions of said first and second drive signals.

3. The circuit as recited in claim 1, wherein said summation is a common mode injection of said full-wave rectified signal into said first drive signal to produce a first composite input waveform and into said second drive signal to produce a second composite input waveform, permitting a continual adjustment of the operating angle of said push-pull amplifier from Class A through Class B.

4. The circuit as recited in claim 3, wherein said first and second composite input waveforms prevent the output stages of said push-pull amplifier from fully reaching cutoff.

5. The circuit as recited in claim 1, wherein said first set of current sources comprises three duplicate current sources each mirroring said first drive signal and said second set of current sources comprises three duplicate current sources each mirroring said second drive signal.

6. The circuit as recited in claim 1, wherein said push-pull amplifier is a current mirroring circuit.

7. The circuit as recited in claim 1, wherein said transformer is an autotransformer.

8. A method of controlling the operating angle of an amplifier, comprising the steps of:
   providing a differential push-pull current drive source having first and second drive signals coupled to a push-pull amplifier, said first and second drive signals being out of phase with one another;
   producing a full-wave rectified signal substantially representing the combined lower halves of said first and second drive signals;
   summing said full-wave rectified signal with said first and second drive signals; and
   summing first and second output signals from output stages of said pushpull amplifier.

9. The method as recited in claim 8, wherein said producing is by a preprocessing circuit coupled to said push-pull amplifier comprising a first set of current sources which mirror said first drive signal and a second set of current sources which mirror said second drive signal.

10. The method as recited in claim 8, wherein said first and second output signals are summed in an output transformer.

11. The method as recited in claim 8, wherein said full-wave rectified signal is at a minimum during the peak signal excursions of said first and second drive signals.

12. The method as recited in claim 8, wherein said summing said full-wave rectified signal with said first and second drive signals comprises the step of injecting in a common mode said full-wave rectified signal into said first drive signal to produce a first composite input waveform and into said second drive signal to produce a second composite input waveform, permitting a continual adjustment of the operating angle of said push-pull amplifier from Class A through Class B.

13. The method as recited in claim 12, wherein said first and second composite input waveforms prevent the output stages of said push-pull amplifier from fully reaching cutoff.

14. The method as recited in claim 9, wherein said first set of current sources comprises three duplicate current sources each mirroring said first drive signal and said second set of current sources comprises three duplicate current sources each mirroring said second drive signal.

15. The method as recited in claim 8, wherein said output stages are coupled to a transformer and said first and second output signals are summed out of phase in said transformer.

16. The method as recited in claim 15, wherein said transformer is an autotransformer.

17. The method as recited in claim 8, wherein said push-pull amplifier is a current mirroring circuit.

* * * * *